United States Patent [19]
Casey

[11] Patent Number: 5,111,150
[45] Date of Patent: May 5, 1992

[54] PRECISION PHASE SHIFT SYSTEM

[75] Inventor: David D. Casey, Overland Park, Kans.

[73] Assignee: Garmin Corporation, Lenexa, Kans.

[21] Appl. No.: 588,288

[22] Filed: Sep. 26, 1990

[51] Int. Cl.⁵ .............................................. H03B 3/04
[52] U.S. Cl. .................................... 328/155; 328/55; 328/72; 307/511
[58] Field of Search ........................... 328/155, 55, 72; 307/510, 511, 262; 375/111; 364/448, 449

[56] References Cited

U.S. PATENT DOCUMENTS

| | | | |
|---|---|---|---|
| 3,374,359 | 3/1968 | Anderson | 307/511 |
| 3,916,329 | 10/1975 | Hekimian et al. | 328/155 |
| 4,013,969 | 3/1977 | Dennison | 328/55 |
| 4,143,328 | 3/1979 | Kurita et al. | 328/155 |
| 4,242,639 | 12/1980 | Boone | 328/55 |
| 4,633,194 | 12/1986 | Kikuchi et al. | 328/155 |
| 4,677,395 | 6/1987 | Baker | 331/25 |
| 4,896,337 | 1/1990 | Bushy, Jr. | 328/155 |

Primary Examiner—Stanley D. Miller
Assistant Examiner—Sinh Tran
Attorney, Agent, or Firm—Hovey, Williams, Timmons & Collins

[57] ABSTRACT

A precision phase shift system presents advantageous utility in navigation systems using signals from global positioning satellites. In particular, the system hereof provides precise control over successive phase-shifting steps of output signals which allows precise matching with corresponding object signals for subsequent decoding thereof.

27 Claims, 2 Drawing Sheets

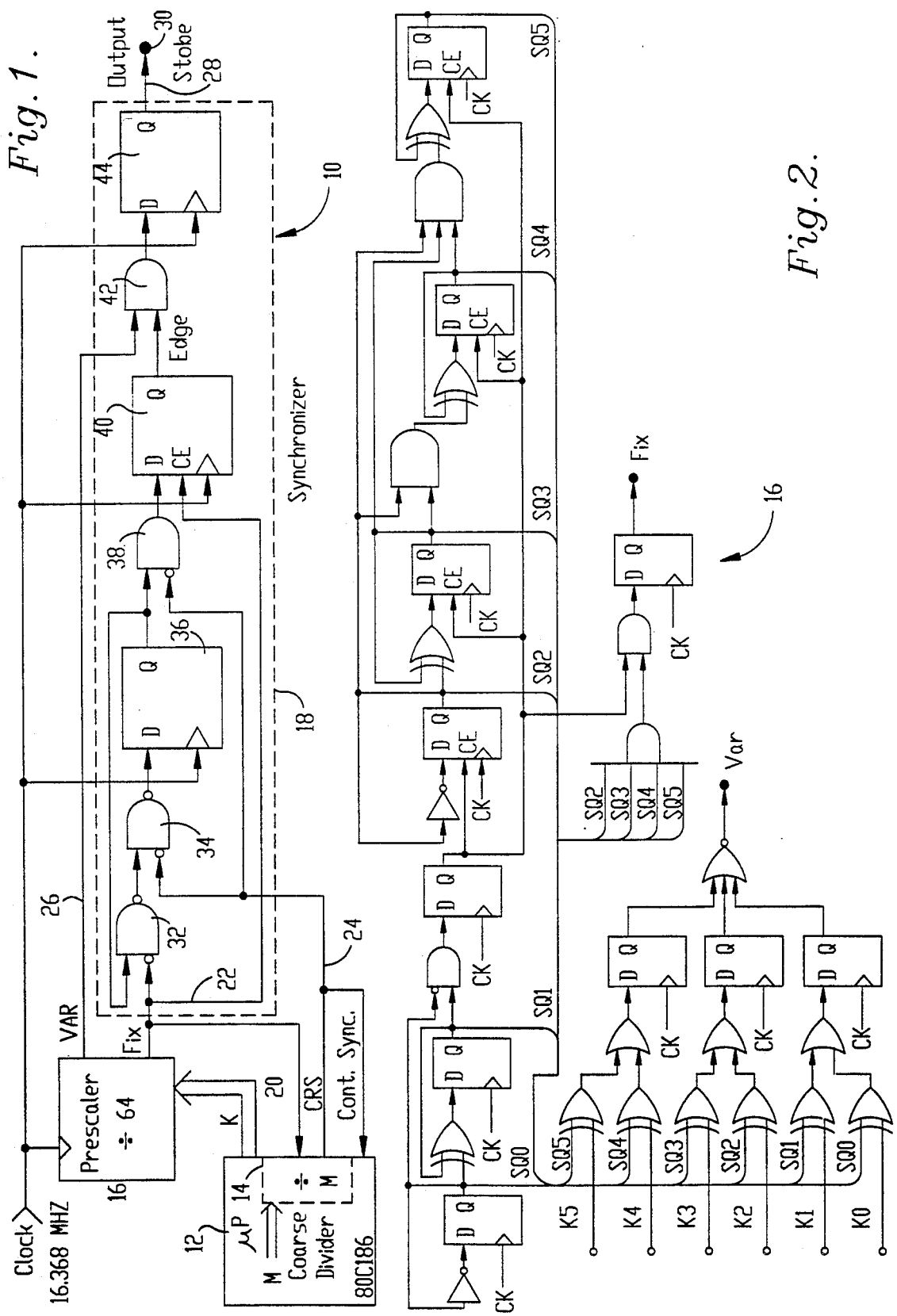

PRECISION PHASE SHIFT SYSTEM

BACKGROUND OF THE INVENTION

1. Field of the Invention

The present invention is concerned with a precision phase shift system which provides precise control over successive phase-shifting steps of output signals and which allows precise matching with corresponding object signals for subsequent decoding thereof.

2. Description of the Prior Art

In the decoding of signals such as those received from a global position satellite, it is necessary to synchronize with the incoming signals. In order to do this, the internally generated signals must match both the frequency and phase of the incoming signals. In the prior art, matching the phase of the internal and received signals has presented the greatest difficulty.

For example, the prior art discloses a synchronous counter which phase shifts a signal over an entire period by performing many counter increments. To gain acceptable precision, the counter and associated components must have sufficient capacity to step through the many required steps. This results in a large number of components which increases the complexity, size and cost of the circuitry.

Variable modulus counters which are often used in frequency generators are also sometimes used for phase shifting. These types of counters, however, present the same disadvantages of complexity, size and cost. Accordingly, the prior art points out the need for a system which allows very precise phase shifting of a signal while minimizing the number of components, size, and manufacturing cost.

SUMMARY OF THE INVENTION

The precision phase-shift system of the present invention solves the prior art problems discussed above and presents a distinct advance in the state of the art. More particularly, the system hereof allows very precise control over the phase shifting of output signals in an efficient manner which allows increased resolution between minimum time intervals.

Broadly speaking, the invention hereof produces a series of output signals with a controllable interval between successive outputs signals. That is to say, the preferred apparatus generates an output signal which is produced in respone to a base signal at a first frequency. The output signal is then phase-shifted relative to the base signal in a plurality of successive steps. The base signal is then shifted to a second frequency for at least one cycle to allow corresponding output signal. The base signal is then shifted back to the first frequency.

In the preferred embodiment, the phase-shifting steps are performed in very small incremental steps over a small portion of the period of the base signal at the first frequency. The second frequency is slightly higher than the first which produces the base signal having a period slightly shorter for one cycle. When the base signal returns to the first frequency, the net effect is a small offset in phase which allows the phase relationship to again be shifted in small steps over a new portion of the base signal period.

The preferred apparatus includes a microprocessor having an internal divider for producing base signals, a prescaler for producing phase shift signals, and a synchronizer for producing required output signals. The prescaler is responsive to phase data signals received from the microprocessor for shifting the phase shift signals through the desired steps. Other preferred aspects of the present invention are discussed further hereinbelow.

BRIEF DESCRIPTION OF THE DRAWING FIGURES

FIG. 1 is an electrical schematic and block diagram illustrating the preferred phase shift apparatus;

FIG. 2 is an electrical schematic diagram illustrating the components of the prescaler of FIG. 1.

DESCRIPTION OF THE PREFERRED EMBODIMENT

Figure 3:
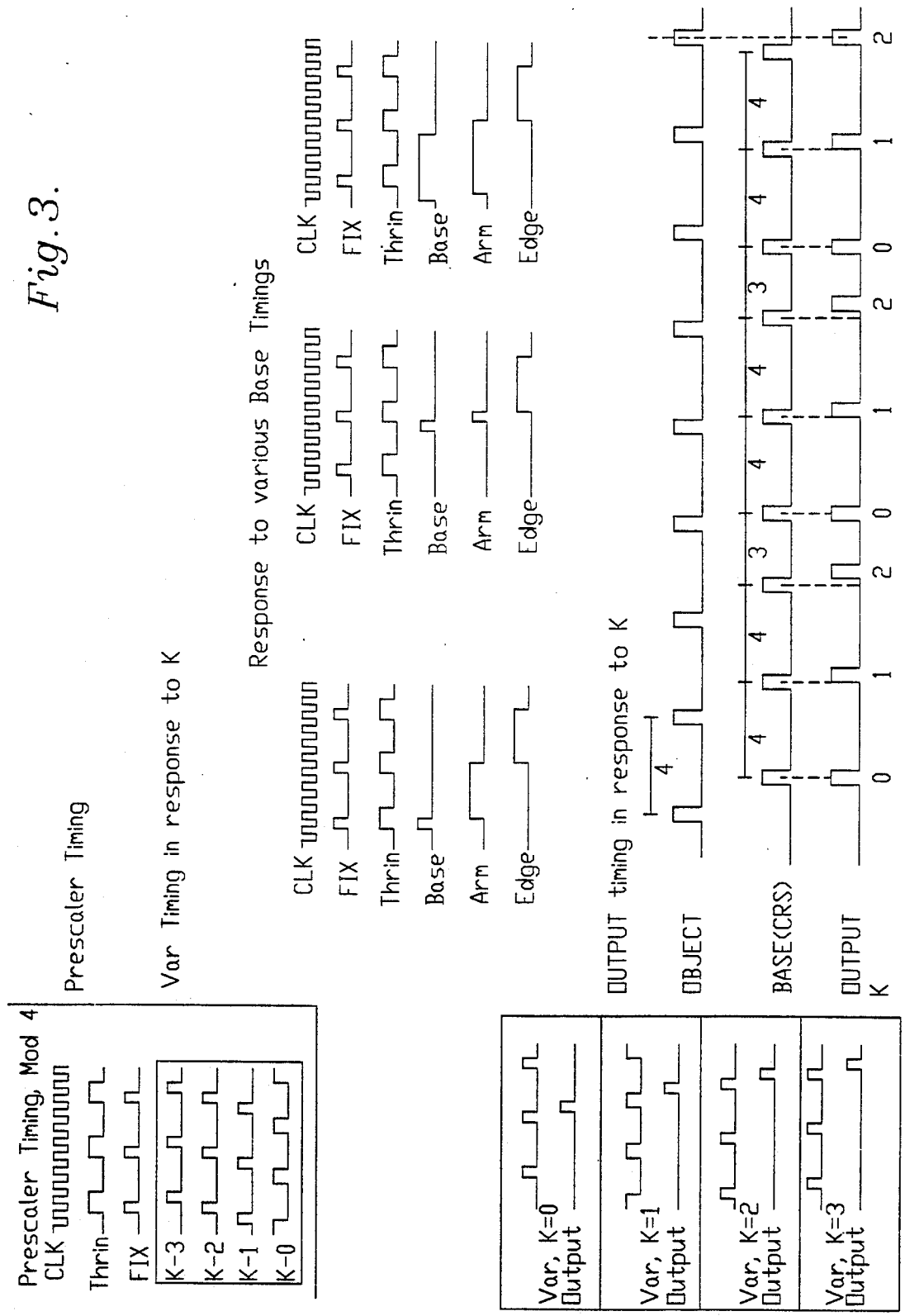
FIG. 3 is a graphical representation of the operation of the apparatus of FIG. 1 showing various signal timing state diagrams for an illustrative example.

Preferred phase shift apparatus 10 includes microprocessor 12 (type 80C186) having internal coarse divider 14, prescaler 16 and synchronizer 18. Preferred clock pulses from a conventional source thereof are supplied to the various components at 16.368 megahertz. In the preferred embodiment, apparatus 10 is advantageously included as part of a global positioning navigation system such as that produced by Pronav International, Inc. of Lenexa, Kans.

In general, microprocessor 12 using coarse divider 14 produces a series of base signals "CRS" which approximate desired signal timing. Prescaler 16 generates the "FIX" clock for coarse divider 14 and synchronizer 18. Prescaler 16 also generates phase-shift signals "VAR" which are phase shifted relative to the FIX signals and are generated in response to phase data signals "K" from divider 14. Synchronizer 18 is responsive to the VAR, FIX and CRS signals to produce the desired output signal sequence. Conventional clock signals at 16.368 MHz log a period less than or equal to the desired time resolution and are used by prescaler 14 and synchronizer 18. In the preferred embodiment, the period of the FIX signals is long enough for proper operation of the supplied components and is greater than the uncertainty in the clock-to-output delay. The CRS signal has a pulse width longer than one cycle of the synchronizer clock signal. This produces an advantage in that the duty cycle of the CRS signals is not critical to proper operation. Thus, various timer components may be substituted in the design without modification of synchronizer 18.

Microprocessor 12 supplies six-bit phase data signals over bus 20 to prescaler 16. As shown in FIG. 1, the value of the phase data is represented by "K" and is controlled by microprocessor 12 in 64 increments from 0 through 63. Microprocessor 12 receives fixed frequency signals (FIX) from prescaler 16 by way of line 22 which are used by coarse divider 14 to produce base signals (CRS) at frequencies determined by the divider values "M" (16 bit) supplied internally from microprocessor 12. In the preferred operation, the value of M is shifted between 255 and 256 as discussed further hereinbelow. Base signals CRS are supplied by way of line 24 to synchronizer 18 and are also used as a feedback to provide control synchronization as shown in FIG. 1. Control of the values of K and M is preferably accomplished with software according to techniques well known by those skilled in the art.

Prescaler 16 receives clock signals at 16.368 MHz and divides these by a preferred factor of 64 to produce a fixed output signal (FIX) on line 22 at about 255.75 KHz and a phase-shift signal (VAR) on line 26 at the same frequency. Phase shift signal VAR is shifted in phase relative to signal FIX according to the phase data value of K. FIG. 2 is an electrical schematic diagram illustrating the component details of the preferred configuration of prescaler 16. As illustrated in FIG. 2, prescaler 16 includes conventional AND, OR, and exclusive OR gates and flip-flops interconnected as shown and conventionally operable to divide the incoming clock signals by a factor of 64 to produce signal FIX at 255.75 KHz. Additionally, phase data signals received over bus 20 contain the phase shift data K represented by K0–K5 in FIG. 2. The phase data information represented by the value of K serves to cause a time delay in the output of signal VAR relative to signal FIX. For example, if K=0, then signal VAR experiences no phase shift delay. On the other hand, if K=63, then signal VAR is delayed relative to signal FIX by nearly a full cycle (63/64).

Synchronizer 18 receives base signals on line 24 from coarse divider 14, receives FIX signals on line 22 from prescaler 16, and receives phase shift signals VAR on line 26 also from prescaler 16. In response, synchronizer 18 produces output signals on line 28 to output terminal 30 which are time delayed relative to the base signals in accordance with the phase shift designated by phase shift signals of the VAR.

Synchronizer 18 includes NAND 32 having an inverted input receiving FIX signals over line 22. The output from NAND 32 is connected to NAND 34, the other input of which is inverted and receives base signals over line 24. The output from NAND 34 is connected to terminal D of flip-flop 36. Flip-flop output Q is connected to the other input of NAND 32 and to one input of AND 38, the other input of which is inverted and receives the base signals by way of line 24.

The output from AND 38 is connected to terminal D of flip-flop 40. The flip-flop clock enable terminal CE receives FIX signals over line 22. Terminal Q of flip-flop 40 provides an "edge" output and is connected to one input of AND 42, the other input of which is connected to line 26 for receiving phase shift signals thereon. The output from AND 42 is connected to terminal D of flip-flop 44. The output Q provides the output signals on line 28 to output terminal 30.

In the operation of synchronizer 18, NAND gates 32, 34, flip-flop 36, and AND 38 synchronize the base signals on line 24 with prescaler output signals FIX. Base signal pulses on line 24 delivered to flip-flop 40 are clocked through to AND 42 but are delayed thereby until a phase shift signal is received from prescaler 16 over line 26. When this occurs, the output to AND 42 goes active to flip-flop 44 which clocks through to output terminal 30 on the next clock pulse. In this way, the output signal terminal 30 is phase delayed relative to the base signal on line 24 until the phase shift signal on line 26 is received at AND 42. And, the phase shift signal VAR is delayed relative to prescaler signal FIX according to the value K.

The frequency of base signals CRS is determined by the frequency of prescaler output signals FIX divided by M in coarse divider 14. In the example hereof, prescaler output signals FIX are at about 255.75 KHz which are divided by M at 255 to yield base signal at a first frequency of about 1.002941 KHz. Similarly, with M at 256, the base signals are at a second frequency of about 0.999023 KHz.

Global positioning satellite signals provide navigation information at a frequency of about 1.0 KHz and each period of information includes 1023 (chips). This information is transmitted in a pseudo-random code. To extract this information, a navigation receiver must generate a matching signal at about the same period (1.0 milliseconds) with the same pseudo-random code. Furthermore, the generated signal must be matched in phase with the satellite information period, and this matching must be done very precisely. That is to say, to achieve the precise phased match, the receiver must be capable of precisely phase shifting internally generated signal in fractional increments of a chip.

The present invention allows generation of an output signal which can be used for triggering or strobing internally generated signals, and which can be precisely phase shifted in increments of 1/16th of a chip until a lock is achieved with the information period of the satellite signal.

The difference in the two base signal periods of about 4 microseconds (us.) corresponds to about 4 chips of information. Because K provides 64 increments or steps over 4.0 us., each step corresponds to 1/16th of a chip. As those skilled in the art will appreciate, this level of precision provides a distinct advance in the state of the art while doing so with structural simplicity and low cost.

FIG. 3 is a graphical representation of the operation of apparatus 10 illustrating object signals which must be phased matched such as those discussed above from a global positioning satellite. FIG. 3 further illustrates base signals and the output at terminal 30 for selected values of K. As can be appreciated, the values used in the illustration of FIG. 3 are for illustration. For example, only three values of K are shown, but in the preferred embodiment 64 values are used. Similarly, the period shifts in the base signals (CRS) are also exaggerated for the purposes of illustration.

In the example of FIG. 3, base signals are initially generated at a first frequency corresponding to a period of four units. In the first cycle, K=0 and the output is thus in-phase with the corresponding base signal. That is to say, there is no phase delay between the phase signal and the output signal. As illustrated, K=1 for the next cycle and thereby experiences a phase delay of about one-third. When K=2, the output signal is further delayed by another one-third.

After K has been incremented through its available steps (three steps in this example), the base signal is shifted to a second frequency for one cycle which corresponds to three units, as shown in FIG. 3. The value of K is reset to zero and the phase shifting steps are again initiated for successive cycles.

As FIG. 3 illustrates, the output signal is phase shifted relative to the object signal until the object and output signals are aligned in-phase as shown by the last pulses of FIG. 3. In other words, the output signal is phase shifted in increments corresponding to a portion of the period of the base signal. The base signal is then phase shifted by this portional amount and the output signal again phase shifted in steps to seek a match in this new portion of the period. In this way, successive portions are tested for phase alignment over an entire period, if necessary, until phase lock is achieved.

As those skilled in the art will appreciate, the present invention encompasses many variations in the preferred embodiment described herein. For example, the various signals could be generated as analog signals instead of the preferred digital which finds widespread utility. In such an embodiment, it might also be desirable to use signal generators other than the preferred microprocessor 12 under software control. In other words, providing values M and K could be accomplished entirely with hardware.

In applications using components in which the CRS signal has the duration of a single FIX signal cycle, it may be advantageous to eliminate components 32, 34, 36 and 38 from synchronizer 18 and connect the signal on line 24 directly to the D input of component 40. In uses where the short pulse width of the FIX signal cannot be used, the Most Significant Bit of prescaler 14 can be substituted. In cases with a minimum clock-to-output delay, it may be desirable to operate at a higher frequency by clocking from the MSB of prescaler 14 and adjusting the prescaler state decoded for FIX to center the expected time delay between two FIX signals.

Having described the preferred embodiments of the present invention, the following is claimed as new and desired to be secured by Letters Patent:

1. An apparatus for producing selectively phase-shifted output signals comprising:
   base signal means for producing periodic base signals and for selectively changing the frequency thereof between first and second frequencies;
   output means operably coupled with said base signal means for producing output signals in response to said base signals, said output signals presenting a phase relationship with said base signals; and
   phase shift means for producing phase shift signals representative of a plurality of successive phase shifting steps,
   said output means including means responsive to said phase shift signals for shifting the phase of said output signals relative to said base signals in said plurality of successive phase shifting steps over a plurality of successive cycles,
   said base signal means including means for maintaining said base signals at said first frequency during said phase shifting steps, for subsequently changing said base signals to said second frequency for at least one cycle in order for said output means to produce at least one corresponding output signal in response, and for subsequently changing said base signal to said first frequency.

2. The apparatus as set forth in claim 1, said output means including means for producing said output signals at the same frequency as said base signals.

3. The apparatus as set forth in claim 1, said output means including means for configuring said output signals for establishing phase lock with navigation signals received from a global positioning satellite with the navigation signals presenting information in chips of data, said phase shifting steps being steps less than one chip of data.

4. The apparatus as set forth in claim 3, each of said phase shifting steps being one-sixteenth of a chip.

5. The apparatus as set forth in claim 1, said base signal means including a microprocessor operable for producing said base signals.

6. The apparatus as set forth in claim 1, said first frequency being about 1.003 KHz.

7. The apparatus as set forth in claim 6, said second frequency being about 0.999 KHz.

8. The apparatus as set forth in claim 1, said base, phase shift and output signals being digital signals.

9. The apparatus as set forth in claim 1, said phase shift means including means for producing reference signals with said phase shift signals being shifted in phase relative to said reference signals.

10. The apparatus as set forth in claim 9, said reference and phase shift signals presenting frequencies different than the frequency of said base signals.

11. The apparatus as set forth in claim 9, said base signal means including means for receiving said reference signals from said phase shift means and responsive thereto for producing said base signals in correlation with said reference signals.

12. The apparatus as set forth in claim 11, said phase shift means being responsive to phase data signals for producing said phase shift signals having a phase relationship with said reference signals in accordance with said phase data signals.

13. The apparatus as set forth in claim 12, said base signal means including means for producing said phase data signals.

14. The apparatus as set forth in claim 13, said base signal means including means for sequentially altering said phase data signal in order to sequentially change the phase relationship between the phase shift signals and said reference signals, and thereby sequentially change the phase relationship between said output signals and said base signals.

15. A method of producing selectively phase-shifted output signals comprising the steps of:
   (a) producing periodic base signals at a first frequency;
   (b) producing output signals in response to said base signals, said output signals presenting a phase relationship with said base signals;
   (c) shifting the phase of said output signals relative to said base signals in a plurality of successive phase-shifting steps over a plurality of successive cycles;
   (d) changing the frequency of said base signals to a second frequency for at least one cycle thereof and, in response, producing at least one corresponding signal; and
   (e) changing the frequency of said base signals to said first frequency.

16. The method as set forth in claim 15, step (b) further including the step of generating said output signals at same frequency as said base signals.

17. The method as set forth in claim 15, further including the step of configuring said output signals for establishing phase lock with navigation signals received from a global positioning satellite with said navigation signals presenting information in chips of data, said phase-shifting steps each being less than one chip of data.

18. The method as set forth in claim 17, each of said phase shifting steps being about one-sixteenth of a chip of data.

19. The method as set forth in claim 15, step (a) including the step of producing said base signals with a microprocessor.

20. The method as set forth in claim 15, including the step of producing said first frequency at about 1.003 KHz.

21. The method as set forth in claim 20, including the step of producing said second frequency at about 0.999 KHz.

22. The method as set forth in claim 15, said base and output signals being digital signals.

23. The method as set forth in claim 15, step (b) including the step of producing reference signals and producing said phase shift signals having a selectable phase relationship with said reference signals.

24. The method as set forth in claim 23, further including the step of producing said base signals in correlation with said reference signals.

25. The method as set forth in claim 24, further including the step of producing phase data signals and shifting the phase of said phase shift signals relative to said reference signals in response and in correlation with said phase data signals.

26. The method as set forth in claim 25, further including the step of sequentially altering said phase data signals in order to sequentially alter the phase relationship between said phase shift signals and said reference signals, and thereby sequentially alter the phase relationship between said output signals and said base signals.

27. The method as set forth in claim 15, further including the step of repeating steps (c), (d) and (e) so that successive output signals present respective phase relationships relative to said base signals through the time period of said base signals at said first frequency.

* * * * *